(12) United States Patent
Lo et al.

(10) Patent No.: US 6,717,811 B2
(45) Date of Patent: Apr. 6, 2004

(54) HEAT DISSIPATING APPARATUS FOR INTERFACE CARDS

(75) Inventors: Chih-Ching Lo, Taipei (TW); Ching-Hung Chen, Taipei (TW); Cheng-Cheng Chen, Shindian (TW)

(73) Assignee: Abit Company Corporation (TW)

( * ) Notice: Subject to any disclaimer, the term of this patent is extended or adjusted under 35 U.S.C. 154(b) by 0 days.

(21) Appl. No.: 10/301,792

(22) Filed: Nov. 22, 2002

(65) Prior Publication Data

US 2004/0017658 A1 Jan. 29, 2004

(30) Foreign Application Priority Data

Jul. 23, 2002 (TW) ........................................ 91211178 U

(51) Int. Cl.[7] ................................................ H05K 7/20
(52) U.S. Cl. ................. 361/698; 165/104.33; 174/15.2; 257/715; 361/700
(58) Field of Search ........................ 165/80.3, 80.4, 165/121–126, 104.33; 257/715, 722; 454/184; 174/15.2, 16.3; 361/687, 694–698, 699, 700, 703, 717–720

(56) References Cited

U.S. PATENT DOCUMENTS

| | | | | |
|---|---|---|---|---|
| 6,058,012 A | * | 5/2000 | Cooper et al. | 361/704 |
| 6,243,263 B1 | * | 6/2001 | Kitahara | 361/695 |
| 6,351,382 B1 | * | 2/2002 | Nakanishi et al. | 361/700 |
| 6,424,528 B1 | * | 7/2002 | Chao | 361/700 |
| 6,512,673 B1 | * | 1/2003 | Wiley | 361/695 |
| 6,549,404 B1 | * | 4/2003 | Kitahara et al. | 361/695 |

OTHER PUBLICATIONS

USPGPUB 2002/0195232 A1, Feb. 20, 1998, Katsui.*

* cited by examiner

Primary Examiner—G. Tolin
(74) Attorney, Agent, or Firm—Birch, Stewart, Kolasch & Birch, LLP

(57) ABSTRACT

A heat dissipating apparatus for use with an interface card including a display card or other add-on card has a heat sink, a heat pipe located on the heat sink and an airflow generator located on the hear sink. The apparatus can discharge heat generated by the interface card to the outside of the computer casing so that heat is not trapped inside the computer casing thereby achieving effective heat dissipation.

13 Claims, 4 Drawing Sheets

HEAT DISSIPATING APPARATUS FOR INTERFACE CARDS

FIELD OF THE INVENTION

The present invention relates to a heat dissipating apparatus for interface cards and particularly a heat dissipating apparatus mounted onto an interface card for discharging heat generated by the interface card outside the computer casing in order to achieve heat dissipation effectively.

BACKGROUND OF THE INVENTION

In computer products, heat dissipation is a problem that often baffles users. The computers often malfunction or are not able to operate due to overheating. Thus, heat dissipation has become a critical issue most vendors are trying to resolve. Conventional heat dissipation apparatus include heat sinks, fans and heat pipes. The heat sink usually has a plurality of metal fins located on one side thereof to reduce the temperature of computer devices. The commonly used one is a passive heat sink. It can generate convection or does not need additional airflow to disperse heat. The heat sink mainly aims at increasing the radiation area. While the heat sink can increase the radiation area, heat energy still has to be discharged by airflow in the surroundings. The air fan aims at improving heat discharge. In general, the air fan generates airflow to carry heat energy away from the heat sink. The heat pipe is an advanced technique adapted on electronic devices. It is made from pure oxygen-free copper tubes and copper meshes filled with pure water or acetone as a working fluid. The fluid at the heat receiving end is vaporized to become a vapor phase. The vapor flows in the hollow tube to a cooling end to be cooled and condensed to the fluid phase again. The condensate is seeped and returns to the heat receiving end through capillarity effect to complete the heat absorption and discharge cycle. By means of the phase changes of the working fluid, a great amount of heat energy can be transferred by a small temperature difference. However, all the heat dissipation techniques mentioned above neglect to discharge heat energy outside the machine casing. As a result, the discharged heat energy still remains inside the machine casing, and heat dissipation is not very effective.

In general, in computer systems, CPU, disk drives and display cards are the devices that generate the most heat. However most vendors have mainly focused on providing solutions for heat dissipation of the CPU and disk drives. A monitor consumes the greatest electric power, hence heat energy generation from the display card is also significant. If the heat energy generated by the display card cannot be discharged effectively, performance and service life of the display card will be severely affected.

SUMMARY OF THE INVENTION

Therefore the primary object of the invention is to resolve the aforesaid disadvantages. The invention provides a heat dissipation apparatus on the interface card to discharge heat energy generated by the interface card outside the computer casing so that heat generated by the interface card won't be trapped inside the computer casing thereby to achieve effective heat dissipation and improve operation stability and service life of the interface card.

In order to achieve the foregoing object, the heat dissipation apparatus of the invention includes a heat sink and a heat pipe located on the heat sink and an airflow generator located on the heat sink. The heat sink is mounted onto an interface card to discharge heat generated by the interface card outside the computer casing so that the heat is not trapped inside the computer casing to achieve effective heat dissipation.

The foregoing, as well as additional objects, features and advantages of the invention will be more readily apparent from the following detailed description, which proceeds with reference to the accompanying drawings which are given by way of illustration only, and thus are not limitative of the present invention.

DESCRIPTION OF THE PREFERRED EMBODIMENT

Figure 1:
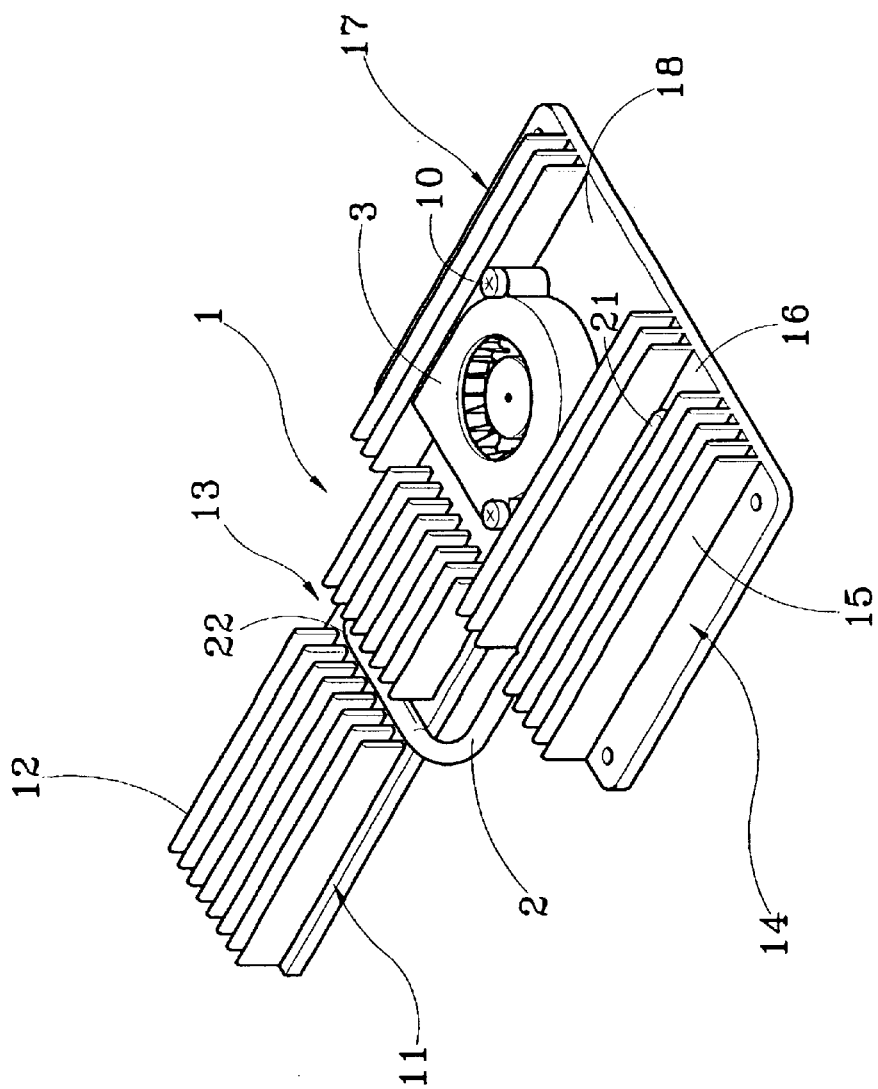
FIG. 1 is a perspective view of the heat dissipation apparatus of the invention.
Figure 2:
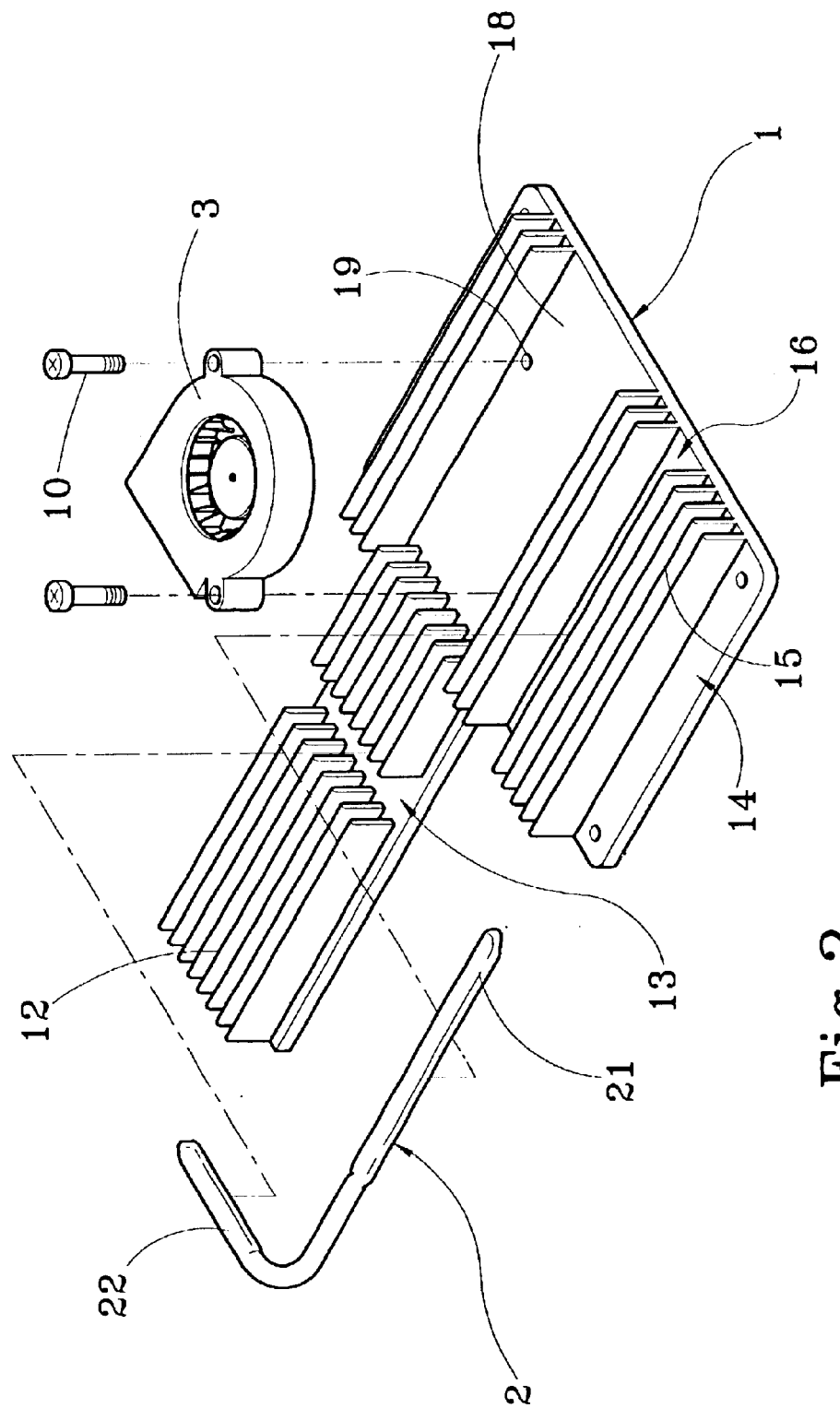
FIG. 2 is an exploded view of the invention according to FIG. 1.

Referring to FIGS. 1 and 2, the heat dissipation apparatus of the invention includes a heat sink 1, a heat pipe 2 located on the heat sink 1 and an airflow generator 3 located on the heat sink 1. The apparatus is mounted onto an interface card (not shown in the drawings) for discharging heat generated by the interface card (such as a VGA display card or other add-on cards) outside the computer casing (not shown in the drawings) so that heat is not trapped inside the computer casing to achieve effective heat dissipation.

The heat sink 1 has a first radiation section 11 located on one side thereof with a plurality of first radiation fins 12 located thereon. The first radiation fins 12 have a first recess 13. The heat sink 1 also has a second radiation section 14 located on another side with a plurality of second radiation fins 15 located thereon. The second radiation fins 15 have a second recess 16. The heat sink 1 further has a third radiation section 17 located on another side opposite to the second radiation fins 15. Between the second radiation section 14 and the third radiation section 17, there is a space 18 for housing the airflow generator 3. The space 18 has at least one aperture 19 for fastening the airflow generator 3 in the space 18 through fasteners 10.

The heat pipe 2 is known in the art, thus its details are omitted here. The heat pipe 2 is filled with working fluid inside (not shown in the drawings). It has one end forming a heat receiving section 21 located in the second recess 16 and another end forming a cooling section 22 located in the first recess 13. When the heat receiving section 21 receives heat from the heat sink 1, the working fluid in the heat receiving section 21 vaporizes to the vapor phase. The vapor flows in the hollow tube of the heat pipe 2 to the cooling section 22 and to be cooled and condensed to liquid phase. The cooled working fluid flows back to the heat receiving section 21 because of capillarity effect, thus completes a heat absorption and discharging cycle.

The airflow generator 3 is a general radial fan or an axial flow fan located in the space 18. Airflow generated by the airglow generator 3 flows to the first radiation section 11 to discharge heat absorbed by the first radiation section 11 through channels formed by the first radiation fins 12 outside the computer casing to achieve effective heat dissipation. The construction set forth above forms a novel heat dissipation apparatus for the interface card.

Figure 3:
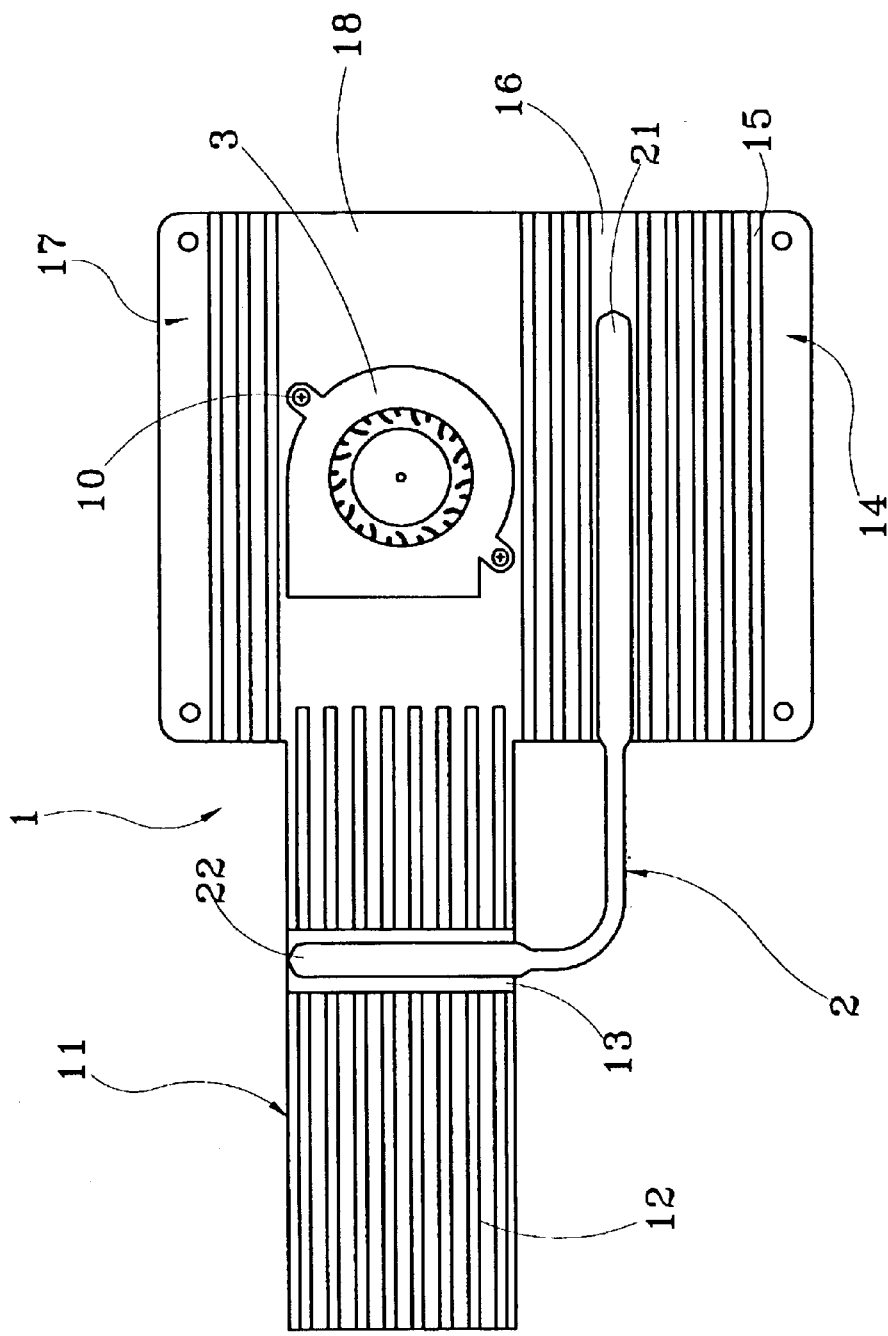
FIG. 3 is a top view of the invention according to FIG. 1.

Referring to FIG. 3, the heat pipe 2 and the airflow generator 3 are installed on the heat sink 1. Heat absorbed by the second radiation fins 15 of the second radiation section 14 of the heat sink 1 is transferred to the heat receiving section 21 of the heat pipe 2, and the working fluid inside the heat receiving section 21 receives the heat and vaporizes to become vapor phase. The vapor flows in the hollow tube of the heat pipe 2 to the cooling section 22. Meanwhile, airglow generated by the airflow generator 3 flows to the first radiation section 11 and the cooling section 22. Heat discharged from the cooling section 22 is dispelled outside the computer casing through the channels formed by the first radiation fins 12 of the first heat radiation section 11. The cooling section 22 cools and condenses the working fluid to liquid phase. Then the cooled working fluid flows back to the heat receiving section 21 because of capillarity effect to complete one heat absorption and discharging cycle. The process is repeatedly carried out to discharge heat generated by the interface card outside the computer casing, and prevent the heat generated by the interface card from being trapped inside the computer casing. Thus the interface card can operate in a stable manner and duration of the interface can increase.

Figure 4:
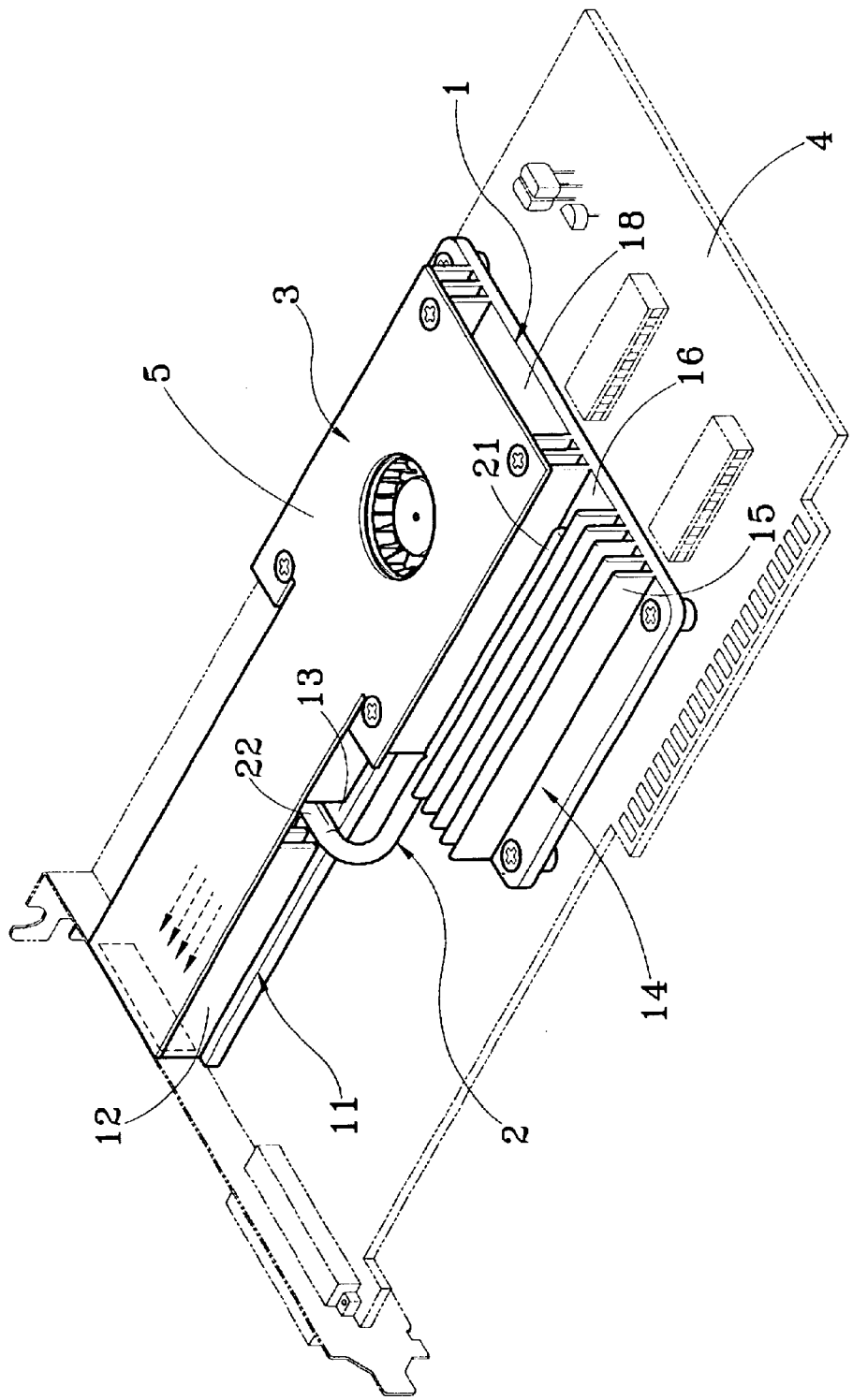
FIG. 4 is a perspective view of the invention in use.

Refer to FIG. 4 for the invention in use. The heat dissipation apparatus of the invention is directly mounted onto an interface card 4 (VGA card), for example, a display card. The heat sink 1 absorbs heat generated by the interface card 4 and discharges the heat through the first radiation section 11 of the heat sink 1 outside the computer casing so that heat generated by the interface card 4 is not trapped inside the computer casing to ensure that the interface card 4 can operate in a stable manner and its duration can increase.

Moreover, a lid 5 may be mounted onto the heat sink 1 to enable the first radiation section 11 of the heat sink 1 to be closed. Heat may be discharged smoothly through the channels formed by the first radiation fins 12 of the first radiation section 11 to the outside of the computer casing.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A heat dissipating apparatus adapted for discharging heat generated by interface cards, the heat dissipating apparatus being in a computer casing and including:

a heat sink having a first radiation section located on one side thereof, a second radiation section located on a second side thereof and a third radiation section located on a third side thereof, the second and third sides being next to one another with a space being located between the second radiation section and the third radiation section, the first radiation section having a first recess and the second radiation section having a second recess;

a heat pipe having a heat receiving section and a cooling section, the heat receiving section being in the second recess and the cooling section being in the first recess; and an airflow generator located in the space;

the heat receiving section receives heat from the heat sink to vaporize working fluid in the heat pipe to a vapor phase which flows to the cooling section to release heat and to be cooled by air from the airflow generator, heat released from the heat pipe being discharged to an outside of a computer casing through the first radiation section, the cooled working fluid flowing from the cooling section back to the heat receiving section through a capillary effect whereby vaporizing and cooling are repeated continuously to disperse heat generated by an interface card.

2. The heat dissipating apparatus of claim 1, wherein the first radiation section, the second radiation section and the third radiation section each have a plurality of radiation fins located thereon.

3. The heat dissipating apparatus of claim 1, wherein the space has at least one fastening aperture therein.

4. The heat dissipating apparatus of claim 1, wherein the airflow generator is one of a radial fan and an axial fan.

5. The heat dissipating apparatus of claim 1, further comprising a lid for the heat sink.

6. The heat dissipating apparatus of claim 1, further comprising means for mounting the heat sink directly on an interface card.

7. The heat dissipating apparatus of claim 1, wherein the first radiation section is next to the space and between the second and third radiation sections.

8. The heat dissipating apparatus of claim 1, wherein the first recess extends in a first direction and the second recess extends in a second direction, the first direction being perpendicular to the second direction.

9. The heat dissipating apparatus of claim 8, wherein the heat pipe has an L-shape.

10. The heat dissipating apparatus of claim 1, wherein the heat pipe has an L-shape.

11. The heat dissipating apparatus of claim 1, wherein the first, second and third radiation sections each have a plurality of radiation fins located thereon, the radiation fins in each of the radiation sections extend in a same longitudinal direction, airflow from the airflow generator generally moves in the longitudinal direction.

12. The heat dissipating apparatus of claim 11, wherein the heat section of the heat pipe extends in the same longitudinal direction as the radiation fins.

13. The heat dissipating apparatus of claim 12, wherein the heat pipe has an L-shape.

* * * * *